US006929848B2

United States Patent
Samuels et al.

(10) Patent No.: US 6,929,848 B2
(45) Date of Patent: Aug. 16, 2005

(54) SHEET MATERIAL ESPECIALLY USEFUL FOR CIRCUIT BOARDS

(75) Inventors: Michael R. Samuels, Wilmington, DE (US); Subhotosh Khan, Midlothian, VA (US); Mikhail R. Levit, Richmond, VA (US)

(73) Assignee: E.I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 10/227,998

(22) Filed: Aug. 26, 2002

(65) Prior Publication Data

US 2003/0087077 A1 May 8, 2003

Related U.S. Application Data

(60) Provisional application No. 60/315,885, filed on Aug. 30, 2001.

(51) Int. Cl.[7] ............... B32B 3/00; B32B 5/06
(52) U.S. Cl. ............. 428/209; 428/297.4; 428/297.7; 428/901; 174/258; 174/259
(58) Field of Search .................. 428/209, 901, 428/297.4, 297.7, 300.1, 1.6; 174/258, 259; 442/376

(56) References Cited

U.S. PATENT DOCUMENTS

| 4,895,752 | A | * | 1/1990 | McEwen | 428/245 |
| 5,196,259 | A | * | 3/1993 | Pierini et al. | 428/297.4 |
| 6,368,698 | B1 | * | 4/2002 | Rokman et al. | 428/209 |
| 2002/0153111 | A1 | | 10/2002 | Kamada | |

FOREIGN PATENT DOCUMENTS

WO     WO 88/04165     6/1988

OTHER PUBLICATIONS

Derwent Publication Ltd., JP 53 111369, Nitto Electric Ind., Co. Sep. 28, 1978, Abstract.

Derwent Publication Ltd., JP 08 252372, Toray Ind. Inc., Oct. 3, 1955, Abstract.

* cited by examiner

*Primary Examiner*—Cathy F. Lam

(57) ABSTRACT

A sheet comprising thermoplastic polymer (TP) and short high tensile modulus fibers, in which the concentration of TP in the middle of the sheet is higher than at the surface of the sheet, useful for making prepregs with a thermoset resin.

15 Claims, 1 Drawing Sheet

SHEET MATERIAL ESPECIALLY USEFUL FOR CIRCUIT BOARDS

CROSS-REFERENCE TO RELATED APPLICATION

This application claims the benefit of U.S. Provisional Application No. 60/315,885, filed Aug. 30, 2001.

FIELD OF INVENTION

The field of invention relates to sheets comprising a thermoplastic polymer having low moisture absorption, and high tensile modulus fibers, prepregs made therefrom, substrates for circuit boards and other devices made therefrom, and methods for making the foregoing.

BACKGROUND

Circuit boards are important items of commerce, being used in virtually every electronic device. The "board" or supporting member of a circuit board and other electronic devices (such as the interposer in a flip-chip package) is an important component of such devices, and properties of the materials used to make such boards are important to the functioning of the electronic or electrical circuit. As electronic components have become more sophisticated, the demands placed upon the materials used for boards have increased. For example, for many applications it is preferred that the board have a coefficient of expansion which matches those of the chips mounted on the board, and/or that the board have a low dielectric constant and a low dissipation factor, especially when high frequency devices are mounted on the board. These three factors are often adversely affected by the absorption of moisture by the board materials, which changes the dimensions of the board and/or changes the dielectric constant and dissipation factor of the board itself, and/or causes warpage.

The simplest boards for relatively nondemanding applications are typically made from a thermoset resin such as an epoxy filled with a fibrous reinforcement such as glass fiber. The glass fiber, often in the form of a woven fabric, is saturated with liquid epoxy resin to form a "prepreg", which is cured in the form of a board. As the demands on boards increase, the glass may be replaced by a higher modulus infusible fiber such as an aramid. However, fibers such as aramid fibers, and epoxy resins, absorb significant amounts of moisture, and so are sometimes unsuitable for use together in highly demanding circuit board uses. Thus, there is a need for improved circuit board materials having reduced moisture absorbance properties.

Japanese Patent Application 2000-334871 describes the preparation of a sheet from which a prepreg may be formed by "laminating" a three-layer structure in which the middle layer may be a nonwoven sheet containing synthetic organic fiber and the two outer layers may contain aramids or other infusible fibers. While this reference discloses that the two outer layers may contain synthetic organic fiber in an amount less than that contained in the inner layer, no mention is made that the laminated sheet contain a nonuniform distribution of synthetic organic fiber through the thickness of the laminated sheet.

Japanese Patent Application 11-117184 describes the preparation of a sheet from which a prepreg may be formed by forming a nonwoven sheet from aramid and LCP (liquid crystal polymers) fibers, heating the sheet under pressure to make the LCP flow, and then adding a thermoset resin to form a prepreg. Nothing is said about variation of the LCP concentration across the thickness of the sheet.

Japanese Patent Application 9-21089 describes the preparation of an LCP nonwoven sheet (paper) which is reported to have low water absorption. Other fibers can also be present in the sheet. The product, after being heated under pressure to partially consolidate the sheet, is apparently still a paper-like material.

Japanese Patent Application 11-229290 describes the preparation of a paper made from LCP and aramid fibers which can be impregnated with an epoxy resin which is then cured. The resulting board may be used as a circuit board. No melting or flow under heat and/or pressure of the LCP is described.

SUMMARY OF INVENTION

Our invention includes:

A sheet comprising (a) one or more nonwoven sheets comprising short high tensile modulus fibers, and (b) thermoplastic polymer having low moisture absorption; wherein at least a portion of said thermoplastic polymer is bound to at least some of said high tensile modulus fibers; and through a cross section of the thickness of said sheet, a concentration of said thermoplastic polymer, relative to a total concentration of said short high tensile modulus fibers is greater at a center of thickness of the sheet than at an outer surface of the sheet.

Structures containing one or more of such sheets together with uncured or cured thermoset resins and/or metal sheets are also described, as are circuit boards comprising these structures.

Also described are processes for making such sheets and structures. The sheets are made by subjecting the thermoplastic polymer and one or more nonwoven sheets comprising one or more of short lengths of high tensile modulus fibers to controlled heat and pressure, such as:

A process for the production of a first sheet material, comprising, heating and applying pressure for a sufficient amount of time to a multilayer second sheet structure, comprising, at least two layers of a nonwoven fabric of short high tensile modulus fibers, and at least one layer containing a thermoplastic with low moisture absorption, provided that the two outer layers of said second sheet structure are said nonwoven fabric, to produce said first sheet material in which:

at least a major portion of said thermoplastic polymer is bound to at least some of said of high tensile modulus fibers; and through a cross section of said first sheet, from the center of thickness of said first sheet to both of the surfaces of said sheet, a concentration of said thermoplastic polymer relative to a concentration of high tensile modulus fibers, decreases.

DETAILED DESCRIPTION OF PREFERRED EMBODIMENTS

Figure 1:
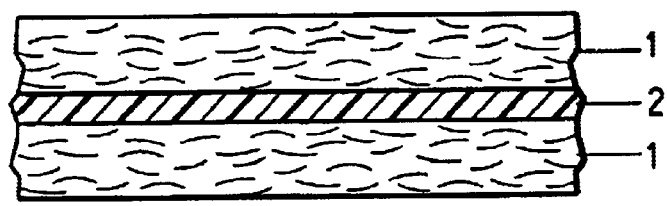
FIG. 1 shows a typical three layer structure made from two outer short high tensile modulus fiber (HTMF) nonwoven layers and a thermoplastic (TP) film inner layer before being subjected to heat and pressure.

Herein certain terms are used. Some of these are defined below.

By a "thermoplastic polymer having low moisture absorption" (TP) is meant a thermoplastic plastic polymer which absorbs less than 1.0 weight percent moisture (based on the weight of the thermoplastic polymer) when measured on a sheet of pure thermoplastic polymer by the method described below. Preferably the moisture absorption of the thermoplastic polymer is about 0.5 weight percent or less, more preferably about 0.25 weight percent or less, and especially preferably about 0.10 weight percent or less.

By "high tensile modulus fibers" (HTMF) are meant these product forms having a tensile modulus of about 10 GPa or more, preferably about 50 GPa or more, more preferably about 70 GPa or more, when measured in accordance with ASTM D885-85 method, using a 1.1 twist multiplier. HTMF herein include high tensile modulus fibers, fibrils and fibrids, unless it is specifically indicated not all three are included.

By a TP being "bound" to a fiber-like material (as in said thermotropic liquid crystalline polymer is bound to at some of said of HTMF) is meant that the TP is "sticking to", contacting over a substantial part of an individual fiber surface, or encapsulating individual fibers. Any TP which is part of a mass (single "piece" or connected network of TP) of TP which is bound to a fiber is considered bound to fiber. Preferably the TP is bound to the fiber by melting or plastic deformation (flow at a temperature below the actual melting point of the TP) of the TP that causes the LCP to contact the HTMF material. For example heating and optionally applying pressure to a mixture of an HTMF and a TP, will cause the TP to flow around the HTMF and result in at least part of the TP being bound to the HTMF.

By "nonwoven HTMF or aramid sheet" or "nonwoven HTMF or aramid fabric" is meant a nonwoven sheet (or fabric) that contains at least 70 percent by volume of HTMF (or specifically aramid) fiber.

By "nonwoven sheet" herein is meant a nonwoven "fabric" formed by any number of different methods, for example wet lay of short fibers (often called a paper), dry lay, flash spun, melt spun, mechanically needled felt, spunlaced. A preferred form of nonwoven sheet is a paper as described in U.S. Pat. Nos. 4,886,578 and 3,756,908, each of which is hereby incorporated by reference in its entirety. This process also includes the optional use of a binder, wherein such binders include, but are not limited to, aramid fibrids as other binders known within the industry may also be used in the process. Dry-laid methods of manufacturing which are well known within the art are described by U.S. Pat. No. 3,620,903, which is hereby incorporated by reference in its entirety.

By "fiber" is meant an object having a length and a maximum cross-sectional dimension, the maximum cross sectional dimension typically being in the range of about 0.3 $\mu$m to about 100 $\mu$m and an aspect ratio (length/width) of $\geq 50$.

By "aramid fiber" herein is meant aromatic polyamide fiber, wherein at least 85% of the amide (—CONH—) linkages are attached directly to two aromatic rings. Optionally, additives can be used with the aramid and dispersed throughout the polyfiber structure, and it has been found that up to as much as about 10 percent by weight of other polymeric material can be blended with the aramid. It has also been found that copolymers can be used having as much as about 10 percent of other diamines substituted for the diamine of the aramid or as much as about 10 percent of other diacid chlorides substituted for the diacid chloride of the aramid.

By "fibrils" herein is meant a fiber-like material having a diameter of about 0.1 $\mu$m to about 25 $\mu$m, and an aspect ratio of 3 to about 100.

By "fibrids" herein is meant very small, nongranular, fibrous or film-like particles with at least one of their three dimensions to be of minor magnitude relative to the largest dimension. These particles are prepared by precipitation of a solution of polymeric material using a non-solvent under high shear.

By "LCP" is meant a liquid crystalline polymer which is anisotropic when tested by the TOT test as described in U.S. Pat. No. 4,118,372, which is hereby incorporated by reference in its entirety. By thermotropic is meant the LCP may be melted and is anisotropic in the melt, as described in the TOT test.

The term "aramid fibrids", as used herein, means nongranular film-like particles of aromatic polyamide having a melting point or decomposition point above 320° C. The aramid fibrids typically have an average length in the range of about 0.2 mm to about 1 mm with an aspect ratio of about 5 to about 10. The thickness dimension is on the order of a fraction of a micrometer, for example about 0.1 $\mu$m to about 1.0 $\mu$m. In addition to aromatic polyamide, aramid fibrids may optionally comprise one or more of dyes, pigments or some other additives such as those described in U.S. Pat. Nos. 5,965,072 and 5,998,309, each of which is hereby incorporated by reference in its entirety.

By "short fibers" or "short lengths" of fibers herein is meant fibers with an aspect ratio preferably of less than about 2000, more preferably about 200–1000, and even more preferably about 250–600.

By "powder" herein is meant a material having an aspect ratio of less than 3. These particles typically have a maximum dimension of about 5 $\mu$m to about 1000 $\mu$m.

By "a" or "an" herein, such as a TP or HTMF is meant one or more.

By "comprising" herein is meant the named items (materials), and any other additional materials or compositions may be present.

Preferred methods for making preferred first sheets of our invention are now described.

One preferred method comprises forming the first sheet from a three layer structure comprising two outer layers and an inner layer therebetween.

The inner layer preferably contains a relatively large amount of TP. The TP may be present in the inner layer as a film, paper, short fiber, fiber, fibrid, fibril, or powder, or any combination of these. Most preferably, the TP is present in the inner layer as a film, paper, or powder. Even more preferably, the inner layer comprises TP film or TP powder. For LCPs, because of the tendency of solid LCPs to fibrillate when worked mechanically, combinations of the above forms when the LCP is in particulate form may be employed. LCPs which are particulates and do not match any of the above particulate definitions may also be used.

The inner layer may also contain some HTMF, for example, it may be an HTMF paper which contains a TP powder which was co-laid with the paper or worked into the paper after the HTMF paper was formed. Alternatively, the inner layer may be a paper containing both HTMF and TP, especially LCP fibers, with a relatively large amount of TP present, or the inner layer may be a TP, especially an LCP paper containing an LCP powder.

The two outer layers are preferably nonwoven HTMF sheets, preferably HTMF papers. They may contain some relatively [compared to the inner layer(s)] small amount of TP, for example in the form of short fibers, fibrils, and/or powder. The inner layer may contain some HTMF, and the outer layers may contain some TP, but the inner layer must be higher in TP concentration than the outer layers.

All of these layers may contain other items, such as antioxidants, pigments, inorganic fillers, and colorants. Preferably, none of these additional items should significantly deleteriously affect the overall performance in the final circuit board.

Other preferred processes for making the first sheet include incorporating the inner (TP, especially LCP, rich) layer in a sandwich structure as a film, a paper, a woven fabric, a resin-rich sheet utilizing other fiber for structural integrity or a non-woven batting or sheet. In addition, the TP could be added directly as a powder or other particulate form through weigh feeding or other controlled metering equipment. The sandwich structure would then be processed with heat and pressure by a press, autoclave, calender rolls or belt press. A continuous process can be envisioned where the resin is introduced as a melt or powder between the two outer (fiber-rich) layers into the entrance nip of a calender rolls or a belt press where heat and pressure is applied. A vacuum applied to the outer side of each fiber-rich outer layer may be used to assist the flow of molten resin into the sheet before pressure is applied, thus setting up the concentration gradient.

In another variation on this method one inner layer (TP rich) and one outer layer (HMTF rich), as described immediately above, are first bonded together, and then two of these bilayer sheets are in turn bonded together with the two original "inner layers" of these bilayer sheets facing each other. These two bilayer sheets are then bonded together. In essence the two "inner layers" of the two bilayer sheets which have been bonded now become a single inner layer, and the original outer layers are in fact the outer layers of the final first sheet produced.

Typically an inner layer will preferably comprise about 20 to about 80 percent by weight, more preferably about 30 to about 50 percent by weight, of TP, based on the total weight of HTMF and TP in the three layer structure. An HTMF paper preferably weighs about 15 to about 200 g/m$^2$. The thickness of the inner layer will be dependent upon its form, for example a film will be thinner than an equivalent (in g/m$^2$) paper or powder. The structure may have more than three layers, so long as the final first sheet has the required attributes.

If another resin, such as a cured or uncured thermoset resin is present, only that part of the sheet which contains TP and/or HTMF (and not only "pure" thermoset) is considered as part of the thickness of the sheet for the purposes of determining relative TP and HTMF concentrations. Where only one or more other resins are present (no HTMF and/or TP), the ratio or relative concentrations of TP and/or HTMF are in a sense meaningless.

Figure 2:
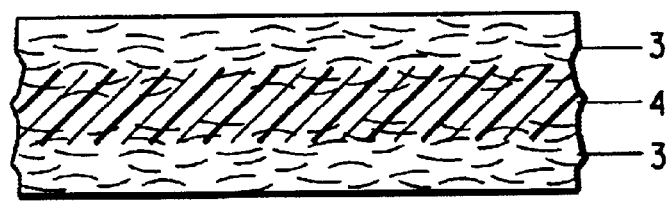
FIG. 2 shows the three layer structure of FIG. 1 after being subjected to heat and pressure to cause the TP present to partially flow "in between" some of the HTMF present.

A cross section of a preferred three layer structure is shown in FIG. 1. It is noted that each of the Figures is not to scale, and the orientation of the aramid fibers shown therein does not necessarily represent a true orientation, but is for illustrative purposes only. Referring to FIG. 1 (shown greatly enlarged through the thickness of the structure), both outer layers 1 are HTMF paper layers, consisting of short HTMF fibers. Inner layer 2, in the middle, is a TP film. In order to form the first sheet, the three layer structure, for example as shown in FIG. 1, is subjected to heat and pressure for a sufficient amount of time to cause at least some of the TP to flow into part of the each of the outer layers 1. This then forms a first sheet as shown in FIG. 2. Here the HTMF paper layers 3 have been partially penetrated by the TP 4. Note that in this illustration only some of the TP has penetrated into each of the HTMF layers, therefore forming a TP concentration gradient in this first sheet. The concentration at the center is 100% TP, while at the outer surfaces of both of outer layers 3 the concentration of TP is zero. If the amount of TP present is small enough there simply may not be enough present to completely fill the voids in the HTMF layers. Note however that if a high enough temperature is applied for a long enough time, the TP may flow enough to form a sheet which is homogeneous with respect to the relative concentrations of TP and HTMF through the thickness of the sheet.

Figure 3:
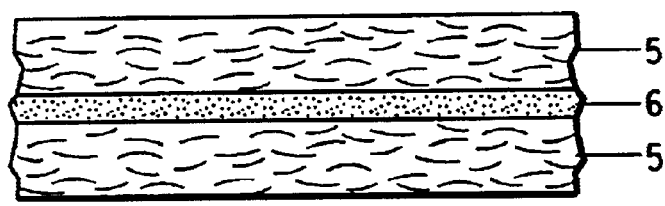
FIG. 3 shows a three-layer structure made from two outer HTMF nonwoven layers and an inner layer which contains TP powder before being subjected to heat and pressure.
Figure 4:
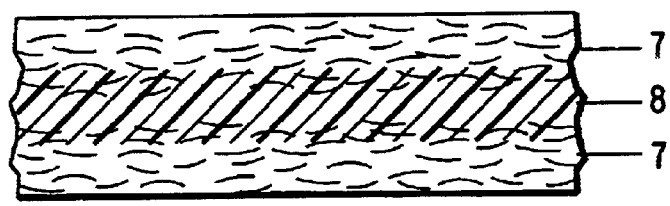
FIG. 4 shows the three-layer structure of FIG. 3 after being subjected to heat and pressure to cause the TP present to partially flow "in between" some of the HTMF present.

FIG. 3 shows another preferred three layer structure, with two outer layers of HTMF paper 5, and an inner layer 6 comprising TP powder. FIG. 4 shows the first sheet formed from the three layer structure of FIG. 3 by the application of heat and pressure, in which the HTMF paper layers 7 have been partially penetrated by the TP 8, now mostly consolidated.

Preferably, at least a portion of the TP is bound to at least some of the HTMF in the resulting first sheet; more preferably, a major portion (i.e., more than half) of the TP in the first sheet is bound to at least some of the HTMF; and even more preferably, essentially all of the TP in the first sheet is bound to at least some of the HTMF.

For example, in FIG. 2, essentially all of the TP present is bound to HTMF, since the TP started as a film which flowed into part of the HTMF paper layers present. In this representation it is assumed TP is interconnected as sort of network, and some of the TP is touching or encapsulating the HTMF (is bound to the HTMF), and so all of the TP is bound to the HTMF. On the other hand in FIG. 4, some of the TP powder particles are shown as not being connected (presumably did not flow) to TP polymer which is bound to HTMF, and so these unconnected particles are not considered bound to the HTMF. The TP which did flow into the HTMF are bound to those fibers.

In the first sheet, through a cross-section of the first sheet, a concentration of TP, relative to the total concentration of the HTMF, is greater at the center of thickness of the first sheet than at an outer surface of the first sheet. More preferably, the concentration of TP at the center of thickness of the first sheet is greater than at both outer surfaces of the first sheet. Even more preferably, when measured from the center of thickness to either outer surface, the concentration of TP exhibits a gradient. The gradient is preferably a generally decreasing function from the center to the outer surface. For example, the gradient may exhibit step changes of decreasing order or may be continuously (smooth) decreasing or may exhibit a series of increases and decreases along an extrapolated decreasing gradient (smooth or step change).

For example, in FIGS. 2 and 4, the concentration gradient of the TP does not have to be a smooth gradient. Rather the gradient as mentioned for the first sheet is over the entire thickness from the center of the sheet to the surface (except that portion which contains only thermoset resin). There may be an abrupt change in the concentrations, as shown in FIG. 2.

In a preferred first sheet, the concentration of TP in the center 10% of the first sheet (5% either side of the center) is preferably about 20% or more, more preferably about 30% percent or more, and especially preferably about 40% or more. In another preferred sheet the concentration of HTMF at 10% of the thickness of the sheet measured from a surface of the sheet is 100% HTMF (no TP), or preferably about 50% or more, more preferably about 75% or more, and especially preferably about 95% or more. All percentages in this paragraph are by volume, based on the total amount of HTMF and TP present in the "thickness layer" specified.

Conditions for forming the first sheet are a combination of temperature (heating), pressure and the amount of time heating and pressure are applied. Generally, the higher the temperature applied, the less the pressure needed and/or the less time needed. The higher the pressure, the lower the temperature needed and/or less time is needed. The longer the time used, the lower the temperature and/or the lower the pressure which may be needed. However, in most cases it may be necessary to heat the TP to at least near its melting point. If too high a temperature, or too high a pressure, or too long a time, or any combination of these is used, the TP may flow enough to form an essentially uniform (through the thickness of the sheet) composition with the HTMF. In this case, the temperature and/or pressure should be lowered and/or the time shortened. If the TP exhibits too little flow, i.e., basically remains a separate layer in the center, then the temperature and/or pressure should be raised, and or the time increased. It is believed that the most important variable is temperature, particularly when approaching the melting point of the TP.

A variety of methods can be used to apply both higher temperatures and pressures. A simple apparatus is a vacuum bag to which heat and pressure may be applied. A press or autoclave may be used. Preferred methods are hot roll and hot belt calendering. Temperatures, pressures, and time of treatment (contact) with the hot roll(s) or belt(s) can be controlled fairly well, as can the final thickness of the first sheet. Calendering is a well known art, see for instance U.S. Pat. No. 3,756,908, which is hereby incorporated by reference in its entirety.

Any TP which has a low moisture absorption, such as perfluorothermoplastics [for example, polytetrafluoroethylene; copolymers of tetrafluoroethylene with hexafluoropropylene, perfluoro(vinyl ethers) such as perfluoro(methyl vinyl ether)], or ethylene; poly(ether-etherketones); poly(ether-ketone-ketones); and poly(etherketones); polyesters such as poly(ethylene terephthalate), poly(ethylene 2,6-napthalate), poly(bisphenol-A isophthalate), poly(bisphenol-A isophthalate/terephthalate); polycarbonates; poly 4-methylpentene; syndiotactic polystyrene; poly(aryl sulfides); poly(ether-imides); poly(aryl ethers); and LCPs are useful. Preferred TPs are perfluoropolymers, particularly those mentioned above, LCPs, and polyesters, and LCPs are especially preferred. Among the preferred properties for the TPs are high melting point, low dielectric constant and low dielectric loss coefficient.

LCPs useful herein include those described in U.S. Pat. Nos. 3,991,013, 3,991,014, 4,011,199, 4,048,148, 4,075, 262, 4,083,829, 4,118,372, 4,122,070, 4,130,545, 4,153,779, 4,159,365, 4,161,470, 4,169,933, 4,184,996, 4,189,549, 4,219,461, 4,232,143, 4,232,144, 4,245,082, 4,256,624, 4,269,965, 4,272,625, 4,370,466, 4,383,105, 4,447,592, 4,522,974, 4,617,369, 4,664,972, 4,684,712, 4,727,129, 4,727,131, 4,728,714, 4,749,769, 4,762,907, 4,778,927, 4,816,555, 4,849,499, 4,851,496, 4,851,497, 4,857,626, 4,864,013, 4,868,278, 4,882,410, 4,923,947, 4,999,416, 5,015,721, 5,015,722, 5,025,082, 5,086,158, 5,102,935, 5,110,896, 5,143,956, and 5,710,237, each of which is hereby incorporated by reference in its entirety, and European Patent Application 356,226. Preferably the TP (especially an LCP) has a melting point of about 180° C. or more, very preferably 250° C. or more, more preferably about 300° C. or more, and especially preferably about 325° C. or more. Melting points are determined by ASTM D3418-82, at a heating rate of 20° C./min. The peak of the melting endotherm is taken as the melting point. These higher melting TPs will allow the circuit board to undergo high temperature processing with less possibility of warping, for example in reflow soldering. Low warpage is an important attribute of the boards used in circuit boards. Another preferred form of LCP is an aromatic polyester or aromatic poly(ester-amide), especially preferred are aromatic polyesters. By an "aromatic" polymer is meant that all of the atoms in the main chain are part of an aromatic ring, or functional groups connecting those rings such as ester, amide, or ether (the latter of which may have been part of a monomer used). The aromatic rings may be substituted with other groups such as alkyl groups. Some particularly preferred aromatic polyester LCPs are those found in U.S. Pat. Nos. 5,110,896 and 5,710,237 listed above. More than one LCP composition may be present in the first sheet, but one is preferred.

The TP may be present in the form of fibers, short fibers, fibrids or fibrils, and any one or more of these may be formed into a nonwoven sheet, with or without other fibers (e.g., HTMF) also being present in the sheet. "Fiber-shaped" LCPs may be formed simply by wet pulping of pieces of LCPs such as pellets. For example the pellets are mixed with moisture, and if desired one or more surfactants, and the mixture subjected to relatively high shear mixing. If the shear applied is high enough the pellets will be broken up into LCP fiber-like particles. Other forms of LCPS, particularly particulate forms, may be used.

Useful HTMFs include organic fibers such as aramids, poly(phenylenebenzobisoxazole), poly(phenylenbenzobisimidazole), poly(phenylenebenzobisthiazole), poly(phenylene sulfide), LCPS, and polyimide, and also inorganic fibers such as glass fibers, silicon carbide, boron nitride, alumina and other whiskers, and Wollastonite. When calculating the concentration of such fibers, the total of these types of fibers present will be used, for example the total of aramid and poly(phenylenebenzobisoxazole) fiber present. Among the preferred properties are high modulus, high melting point and/or glass transition temperature and low moisture absorption.

Aramids, poly(phenylenebenzobisoxazole), poly(phenylenbenzobisimidazole), poly(phenylenebenzobisthiazole), are preferred HTMFs, and aramids are more preferred. Useful aramids include poly(p-phenylene terephthalamide), poly(m-phenylene isophthalamide, and poly(p-phenylene/oxydianiline terephthalamide) copolymers. Preferred aramids are poly(p-phenylene terephthalamide), poly(m-phenylene isophthalamide), and poly(p-phenylene terephthalamide) is especially preferred. A description of the formation of aramid (short) fibers, fibrids and fibrils of various types is found in U.S. Pat. Nos. 5,202,184, 4,698,267, 4,729,921, 3,767, 756 and 3,869,430, each of which is hereby incorporated by reference in its entirety. Description of the formation of nonwoven aramid sheets, especially papers, is found in U.S. Pat. Nos. 5,223,094 and 5,314,742, each of which is hereby incorporated by reference in its entirety. More than one HTMF, including more than one aramid may be present in the first sheet.

Once the first sheet is formed, it may be impregnated with a thermoset resin. Before impregnation the first sheet may be treated to improve the adhesion of the thermoset to the LCP and/or aramid; for example, the first sheet may be surface treated by corona discharge by a plasma treatment. Since the surface of the first sheet will usually be porous to some extent (due to incomplete or no coating of the HTMFs by the TP) the (usually) uncured liquid thermoset resin will penetrate the surface of the first sheet and form an outer layer of uncured thermoset resin on the first sheet. This is termed herein the "prepreg". The thermoset resin may be cured on a single layer of the prepreg, or more than one layer may be stacked together and cured together to form a thicker board. Herein all such cured sheets are called second sheets. A metal such as copper may be placed on one or both surfaces before curing the thermoset resin. This is termed herein the "laminate". Preferred thermoset resins are epoxy resins, polyimides, cyanurate esters and bismaleimide-triazine resins; epoxy resins and bismaleimide-triazine resins are especially preferred.

Circuit boards (including printed wiring boards and printed circuit boards) produced from second sheets and/or laminates usually have low moisture absorption, and/or good high temperature resistance, and/or relatively low coefficients of thermal expansion, and/or low dielectric constant, and/or low warpage, and/or low dielectric loss coefficients, an excellent combination of properties for a circuit board. Once the substrate boards are formed they may be processed by normal methods to make circuit boards. The substrate boards could also be processed by normal methods to make useful composite parts, such as radar domes.

Second sheets containing one or more layers of first sheets may also be used in or as chip package substrates, chip carriers and chip package interposers.

Second sheets may also be combined in laminates with other types of sheets, for example glass fiber prepreg or RCF, for other uses. For example this "cored" structure may be used in printed wiring boards and for chip packaging.

EXAMPLES

The following Examples 1–12 illustrate preferred embodiments of our invention. Our invention is not limited to these Examples 1–12.

Method for determination of moisture absorption at 85° C. and 85% humidity: Five specimens (5×5 cm) of the same sample are dried to constant weight at 105° C. in air, and are placed into a humidity chamber set for 85° C. and 85% humidity. After that, weight gain of the specimens is measured each day. When an average weight gain for three consecutive days is less than 1% of the total weight gain, specimens are deemed to be saturated and average moisture absorption is calculated by dividing the total weight gain by the original weight of the sample and multiplying the result by 100.

In the Examples, except as noted, all of the LCP used had the composition as that of Example 4 of U.S. Pat. No. 5,110,896 i.e. derived from hydroquinone/4,4'-biphenol/terephthalic acid/2,6-naphthalenedicarboxylic acid/4-hydroxybenzoic acid in molar ratio 50/50/70/30/320.

Also in the Examples herein the poly(m-phenylene isophthalamide) fibrids were made as described in U.S. Pat. No. 3,756,908, which is hereby incorporated by reference in its entirety. The poly(p-phenylene terephthalamide) had a linear density of about 0.16 tex and a length of about 0.67 cm (sold by E.I. du Pont de Nemours and Company under trademark KEVLAR® 49).

Poly(ethylene terephthalate) (PET) fiber used: 2.1 dpf, 6 mm long, sold by E. I. DuPont de Nemours & Co., Inc. Wilmington, Del., U.S.A., as merge 106A75.

Glass fiber used: E-type glass fiber 6.5 $\mu$m diameter and 6.4 mm long produced by Johns Manville Co., Denver, Colo. 80217, USA, sold as type M189.

Poly(phenylene oxide) (PPE) resin used was type 63D from the General Electric Co., Pittsfield, Mass., U.S.A.

The epoxy resin system used was grade L-1070, supplied by Fortin Industries.

Example 1

A multilayer structure of:
(1) As-formed paper (68 g/m² basis weight) made from 87% by weight poly(p-phenylene terephthalamide) floc (2.25 denier per filament, 6.7 mm cut length) and 13% by weight poly(m-phenylene isophthalamide) fibrids.
(2) A 56 $\mu$m thick film of LCP. The film had a basis weight of 78 g/m².
(3) Same as layer 2
(4) Same as layer 1.
was prepared [layers (1) and (4) formed the outer surfaces] and passed through a 76.2 cm diameter roll calender at 305 linear cm/minute with the rolls at 350° C. and at a pressure of 263 kN/m of width. The resulting sheet was densified and bonded together. Photomicrographs showed that the LCP layers had flowed into the aramid paper layers, penetrating almost to the outer surfaces but leaving a small quantity of the LCP resin in the middle of the structure. There was no evidence of displacement of the p-aramid fibers by the penetrating resin. The product had a basis weight of 254 g/m², was 292 $\mu$m thick, and an apparent density of 0.87 g/mL. It had a coefficient of thermal expansion of 1.80 ppm/° C. in the machine (calender) direction, and −1.83 ppm/° C. in the transverse direction.

When the same experiment was run only at a roll speed of 183 linear cm/min (in other words a longer contact time with heat and pressure) the LCP had penetrated to within one aramid fiber thickness of the surface, leaving no essentially pure LCP layer of LCP in the sheet. This sheet material had an apparent density of 0.68 g/mL. This illustrates one method of controlling whether an LCP concentration gradient will be obtained.

Example 2

LCP blown film (with nominal thickness of 30 $\mu$m and average basis weight of 41 g/m²) was laminated between two layers of formed paper (same as Layer 1 in Example 1 with basis weight of 31 g/m²) under following conditions in a vacuum press:
(a) held in vacuum (no external pressure or temperature).
(b) Heated to 320° C. (5° C./min) from ambient condition under a pressure of 6.9 MPa.
(c) Held for 1 h at 320° C. and 6.9 MPa.
(d) Cooled to rapidly room temperature (water quench) under pressure.

Laminates were produced with average dimension of 25 cm×20 cm×185 $\mu$m and average weight of 4.7 g (basis weight 100 g/m²). The laminates were approximately 60% paper aramid and 40% LCP.

The laminates from made above were prepregged with a commercial multi-functional epoxy using standard techniques known in the industry. The resulting three component composite (paper+LCP film+epoxy) was 235 $\mu$m thick with an average epoxy content of 46% by weight of the total laminate. The final laminate had approximately 32% aramid, 22% LCP film and 46% epoxy, by weight.

Six of the prepregs were further laminated between two sheets copper (17 μm thick) under following conditions in a vacuum press:

(a) held in vacuum (no external pressure or temperature)
(b) Heated to 200° C. (5° C./min) from ambient temperature condition under a pressure of 6.9 MPa.
(c) Held for 1 h at 200° C. and 6.9 MPa.
(d) Cooled rapidly to room temperature (water quench) under pressure.

The laminates had an average thickness of 850 μm (6 prepregs+2 Cu sheets). After etching away the copper foils, the properties of the polymeric portion of the laminate were measured. Average coefficient of thermal expansion in plane was about 12 ppm/° C. and moisture absorption at 85° C. and 85% humidity was 0.58%.

Comparative Example A

Calendered paper (same as layer 1 of Example 1, with a basis weight of 31 g/m²) was prepreged with commercial multi-functional epoxy as in Example 2.

Thirty-two prepregs made by the above process were further laminated between two Cu sheets (17 μm thick) under the following conditions in a vacuum press:

(a) Held in vacuum (no external pressure or temperature).
(b) Heated to 200° C. (5° C./min) from ambient temperature under a pressure of 6.9 MPa.
(c) Held for 1 h at 200° C. and 6.9 MPa.
(d) Cooled to room temperature fast (water quench) under pressure.

Epoxy resin content in the polymer portion of the final laminate was about 53%. After etching of copper foil, properties of polymer portion of the laminate were measured. CTE in plane was about 12.9 ppm/° C. and moisture absorption at 85° C. and 85% humidity was about 2.1 weight %.

Example 3

LCP blown film (with nominal thickness of 30 μm and average basis weight of 41 g/m²) was laminated between two layers of calendered paper (same as layer 1 of Example 1, with basis weight of 31 g/m²) under following conditions in a vacuum press:

(a) Held in vacuum (no external pressure or temperature).
(b) Heated to 320° C. (5° C./min) from ambient temperature under a pressure of 6.9 MPa.
(c) Held for 1 h at 320° C. and 6.9 MPa.
(d) Cooled to room temperature fast (water quench) under pressure.

Laminates were produced with average dimension of 25 cm×20 cm×90 μm and average weight of 4.6 g (basis weight 94 g/m²). The laminates were approximately 60% aramid and 40% LCP.

The laminates were prepregged with commercial multi-functional epoxy as in Example 2. The resulting three component composite (aramid+LCP film+epoxy) was 150 μm thick with an average epoxy content of 25% by weight of the total laminate. The final laminate had approximately 45% aramid, 30% LCP film and 25% epoxy, by weight.

Six prepregs made by the above process were further laminated between two Cu sheets (17 μm thick) under the following conditions in a vacuum press:

(a) Held in vacuum (no external pressure or temperature).
(b) Heated to 200° C. (5° C./min) from ambient temperature under a pressure of 6.9 MPa.
(c) Held for 1 h at 200° C. and 6.9 MPa.
(d) Cooled to room temperature fast (water quench) under pressure.

The laminates had an average thickness of 600 μm (6 prepregs+2 Cu sheets).

Example 4

LCP blown film (with nominal thickness of 20 μm and average basis weight of 28 g/m²) was laminated between two layers of paper (same as layer 1 of Example 1, with basis weight of 68 g/m²) under following conditions in a calender:

Two aluminum foil sheets with shiny side inside (non-stick) were placed on the outside of the aramid paper layers of the three layer stack, and the resulting 5 layer stack was calendered at 295° C. and 175,000 N/m pressure.

The laminates had an average basis weight of 220 g/m². The laminates were approximately 85% aramid and 15% LCP film by weight.

Example 5

Teflon®-PFA film (a copolymer of tetrafluoroethylene and perfluoro(propyl vinyl ether) available from E. I. DuPont de Nemours & Co., Wilmington, Del., U.S.A., with nominal thickness of 12 μm and average basis weight of 30 g/m².) was laminated between two layers of paper (similar to mat in Layer 1 of Example 1, but with a basis weight of 31 g/m²) under following conditions in a vacuum press:

held in vacuum (no external pressure or temperature)
heated to 305° C. (5° C./min) from ambient condition under a pressure of 6.9 MPa
held for 1 h
cooled rapidly to room temperature (water quench) under pressure.

Laminates were produced with average dimension of 25 cm×20 cm×170 μm and average weight of 4.2 g (basis weight 90 g/m²). The laminates were approximately 65% aramid and 35% Teflon® PFA by weight.

These laminates from were prepregged with commercial multi-functional epoxy as described in Example 2. The resulting three component composite (paper+PFA film+epoxy) was 220 μm thick with an average epoxy content of 48% by weight of the total laminate. The final laminate had approximately 34% aramid, 18% PFA and 48% epoxy by weight.

Two of these prepregs were further laminated between two sheets copper (17μ thick) under following conditions in a vacuum press:

held in vacuum (no external pressure or temperature)
heated to 200° C. (5° C./min) from ambient condition under a pressure of 4.1 MPa
held for 1 hr.
cooled rapidly to room temperature (water quench) under pressure.

Laminates were produced with average thickness of 330 μm (2 prepregs+2 Cu sheets).

Example 6

Tefzel® film (a tetrafluoroethylene/ethylene copolymer available from E.I. DuPont de Nemours & Co., Inc, Wilmington, Del., U.S.A., with nominal thickness of 25 μm and average basis weight of 45 g/m²) was laminated between two layers of aramid paper (same as Layer 1 of Example 1, with basis weight of 68 g/m² ) under the following conditions in a vacuum press:

held in vacuum (no external pressure or temperature)

heated to 260° C. (5° C./min) from ambient condition under a pressure of 6.9 MPa held for 1 h cooled rapidly to room temperature (water quench) under pressure.

Laminates were produced with average dimension of 25 cm×20 cm×350 μm and average weight of 9.4 g (basis weight 180 g/m²). The laminates were approximately 75% aramid and 25% Tefzel®.

The above laminates were prepregged with commercial multi-functional epoxy using techniques standard in the industry. The resulting three component composite (paper+Tefzel®+epoxy) was 520 μm thick. The final laminate had approximately 40% aramid, 13% fluoropolymer and 47% epoxy by weight.

Two of the above prepregs were further laminated between two sheets copper (17 μm thick) under following conditions in a vacuum press:

held in vacuum (no external pressure or temperature)

heated to 200° C. (5° C./min) from ambient condition under a pressure of 4.1 MPa held for 1 hr cooled rapidly to room temperature (water quench) under pressure.

Laminates were produced with average thickness of 600 μm (2 prepregs+2 Cu sheets).

Example 7

Two (2.00) g of poly(p-phenylene terephthalamide) fiber was placed in a laboratory mixer (British pulp evaluation apparatus) with 2500 g of water and agitated for 3 min. Independently, 69.13 g of an aqueous, never-dried, poly(m-phenylene isophthalamide) fibrid slurry (0.43% consistency and freeness 330 ml of Shopper-Riegler) was placed in a same type of laboratory mixer together with about 2000 g of water and agitated for 1 min. Both dispersions were poured together into an approximately 21×21 cm handsheet mold and mixed with addition of about 5000 g of water. The resulting slurry had the following percentages (of total solids) of solid materials:

poly(m-phenylene isophthalamide) fibrids 13%;

poly(p-phenylene terephthalamide) floc 87%.

A wet-laid sheet was formed. The sheet was placed between two pieces of blotting paper, hand couched with a rolling pin, and dried in a hand sheet dryer at about 190° C. The dried sheet had basis weight of about 53.0 g/m². Another (second) handsheet was prepared exactly as described above. Its basis weight after drying was 52.4 g/m².

Two (2.00) g of poly(p-phenylene terephthalamide) fiber was placed in a laboratory mixer (British pulp evaluation apparatus) with 2500 g of water and agitated for 3 min. Independently, 69.13 g of an aqueous, never-dried, poly(m-phenylene isophthalamide) fibrid slurry (0.43% consistency and freeness 330 ml of Shopper-Riegler) was placed in a same type of laboratory mixer together with 2.25 g of 40 mesh particulate LCP and about 2000 g of water and agitated for 1 min. Both dispersions were poured together into an approximately 21×21 cm handsheet mold and mixed with addition of about 5000 g of water. The resulting slurry had the following percentages (of the solids present) of solid materials:

poly(m-phenylene isophthalamide) fibrids 6.5%;

poly(p-phenylene terephthalamide) floc 43.5%; and particulate LCP 50%.

A wet-laid sheet was formed. The sheet was placed between two pieces of blotting paper, hand couched with a rolling pin, and dried in a hand sheet dryer at about 190° C. The sheet had basis weight of about 98.3 g/m².

After that all three formed and dried sheets (two without particulate LCP and one with particulate LCP) were calendered together between two metal rolls of about 20.3 cm diameter at about 350° C. and linear pressure of about 3000 N/cm, while the sheet with particulate LCP was used as an inside layer and the sheets without particulate LCP were used as outside layers. The final calendered sheet had basis weight of about 204 g/m², thickness of about 234 μm and a density of about 0.87 g/cm³ with maximum concentration of LCP in the middle and practically no LCP on the outside surfaces of the sheet.

The 40 mesh particulate LCP was prepared by rough grinding an LCP having the composition of Example 9 of U.S. Pat. No. 5,110,896 derived from hydroquinone/4,4'-biphenol/terephthalic acid/2,6-naphthalenedicarboxylic acid/4-hydroxybenzoic acid in molar ratio 50/50/85/15/320, and which also contained 30% by weight glass fiber, and was in the form of resin pellets (right circular cylinders approximately ⅛" in diameter and length) in a hammer mill with liquid $N_2$ also present, and with a coarse (about 10 mesh) discharge screen. The course cut resin was then placed back in the hammer mill with additional liquid $N_2$ until the final product passed through a 40 mesh screen.

Comparative Example B

Two (2.00) g of poly(p-phenylene terephthalamide) fiber (see Example 7) was placed in a laboratory mixer (British pulp evaluation apparatus) with 2500 g of water and agitated for 3 min. Independently, 69.13 g of an aqueous, never-dried, poly(m-phenylene isophthalamide) fibrid (see Example 7) slurry (0.43% consistency and freeness 330 ml of Shopper-Riegler) was placed in a same type of laboratory mixer together with 2.25 g of LCP powder and about 2000 g of water and agitated for 1 min. Both dispersions were poured together into an approximately 21×21 cm handsheet mold and mixed with addition of about 5000 g of water. The resulting slurry had the following percentages (as a percent of total solids) of solid materials:

poly(m-phenylene isophthalamide)fibrids 6.5%;

poly(p-phenylene terephthalamide) floc 43.5%; and

LCP powder 50%.

A wet-laid sheet was formed. The sheet was placed between two pieces of blotting paper, hand couched with a rolling pin, and dried in a hand sheet dryer at about 190° C. After that the sheet was calendered between two metal rolls of about 20.3 cm diameter at about 350° C. and linear pressure of about 3000 N/cm. The final sheet had basis weight of about 94.6 g/m², thickness of about 104 μm and density of about 0.91 g/cm³ with a uniform distribution of LCP through all the structure.

Example 8

Poly(p-phenylene terephthalamide) fiber (0.84 g) was placed in a laboratory mixer (British pulp evaluation apparatus) with 2500 g of water and agitated for 3 min. Independently, 65.12 g of an aqueous, never-dried, poly(m-phenylene isophthalamide) fibrid slurry (0.43% consistency and freeness 330 ml of Shopper-Riegler) was placed in a same type of laboratory mixer together with 1.68 g of PET floc and about 2000 g of water and agitated for 1 min. Both dispersions were poured together into an approximately 21×21 cm handsheet mold and mixed with an additional about 5000 g of water. The resulting slurry had the following percentages (of total solids) of solid materials:

poly(m-phenylene isophthalamide) fibrids 10%;
poly(p-phenylene terephthalamide) floc 30%;
PET floc 60%

A wet-laid sheet was formed. The sheet was placed between two pieces of blotting paper, hand couched with a rolling pin, and dried in a hand sheet dryer at about 190° C. The dried sheet had basis weight of about 67.0 g/m$^2$. The sheet was placed between two sheets of calendered aramid paper described in example 2. and compressed together in the platen press under the following cycle:
266° C.—0.21 MPa—2 min.>>266° C.—15.9 MPa—2 min.>>93° C.—15.9 MPa—2 min.

The final sheet had basis weight of 135 g/m$^2$, thickness 0.162 mm and density 0.83 g/cm$^3$ with maximum concentration of poly(ethylene terephthalate) at the center (of thickness) of the sheet and practically none of the PET at the outside surface, as observed using an optical microscope.

Example 9

Glass fiber (1.26 g) was placed in a laboratory mixer (British pulp evaluation apparatus) together with 18.06 g of an aqueous, never-dried, poly(m-phenylene isophthalamide) fibrid slurry (0.43% consistency and freeness 330 ml of Shopper-Riegler), 2.52 g of 30 mesh hammer milled LCP pulp prepared as in Example 7 except the final screen was 30 mesh instead of 40 mesh. The LCP composition was that of Example 4 of U.S. Pat. No. 5,110,896, and about 2000 g of water and agitated for 1 min. The dispersion was poured into an approximately 21×21 cm handsheet mold and mixed with an additional about 5000 g of water. The resulting slurry had the following percentages (of total solids) of solid materials:

poly(m-phenylene isophthalamide) fibrids 10%;
glass fiber 30%;
LCP pulp 60%

A wet-laid sheet was formed. The sheet was placed between two pieces of blotting paper, hand couched with a rolling pin, and dried in a hand sheet dryer at about 190° C. Two other handsheets were prepared by the same procedure, but using 3.50 g of glass fiber and 146.5 g of the fibrid slurry for each of them. All three sheets (the sheet with LCP pulp in the middle) were compressed together in the platen press under the following cycle:
349° C.—0.21 MPa—2 min.>>349° C.—15.9 MPa—2 min.>>149° C.—15.9 MPa—2 min.

The final sheet had a basis weight of 325 g/m$^2$, thickness 0.382 mm, density 0.85 g/cm$^3$ with maximum concentration of LCP at a center (of thickness) of the sheet and practically no LCP at the outer surfaces, based on observation with an optical microscope.

Example 10

Glass fiber (1.26 g) was placed in a laboratory mixer (British pulp evaluation apparatus) together with 146.5 g of an aqueous, never-dried, poly(m-phenylene isophthalamide) fibrid slurry (0.43% consistency and freeness 330 ml of Shopper-Riegler), 2.31 g of powdered PPE and about 2000 g of water and agitated for 1 min. The dispersion was poured into an approximately 21×21 cm handsheet mold and mixed with an additional about 5000 g of water. The resulting slurry had the following percentages (of total solids) of solid materials:

poly(m-phenylene isophthalamide) fibrids 10%;
glass fiber 30%;
PPE 60%

A wet-laid sheet was formed. The sheet was placed between two pieces of blotting paper, hand couched with a rolling pin, and dried in a hand sheet dryer at about 190° C. Two other handsheets were prepared by the same procedure, but using 3.36 g of glass fiber and 195.3 g of the fibrid slurry for each of them. All three sheets (the sheet with PPE resin in the middle) were compressed together in the platen press under the following cycle:
327° C.—0.21 MPa—1 min.>>327° C.—5.3 MPa—2 min.>>149° C.—15.9 MPa—2 min.

The final sheet had a basis weight of 312 g/m$^2$, a thickness of 0.428 mm, a density of 0.73 g/cm$^3$, with maximum concentration of PPE resin at the center (of thickness) of the sheet and almost no PPE resin at both outside surfaces.

Example 11

Pellets of Teflon® polymer of tetrafluoroethylene and perfluoro(propyl vinyl ether) available from E. I. DuPont de Nemours & Co., Wilmington, Del., U.S.A., were refined on 30.5 cm diameter Sprout-Waldron Model 12-2 single rotating disc refiner equipped with plates type C-2976-A in one pass at gap between plates of about 25 μm, feeding speed of about 80 g/min. and continuous addition of water in quantity of about 4 kg of water per 1 kg of the pellets. This was used for the stock preparation. Two batches of the stock were prepared. The slurry of the first batch had the following percentages (as a percent of total solids) of solid materials:

poly(m-phenylene isophthalamide)fibrids (freeness 240 ml of Shopper-Riegler) 10%;
poly(p-phenylene terephthalamide) floc 90%.

The slurry of the second batch had the following percentages (as a percent of total solids) of solid materials:

poly(m-phenylene isophthalamide)fibrids (freeness 240 ml of Shopper-Riegler) 8%;
PFA 92%.

Two-ply forming was conducted on an inclined wire papermaking machine with feeding of the slurry of the first batch into the primary headbox and feeding of the slurry from the second batch into the secondary headbox. Headbox consistency in the primary headbox was about 0.01% and headbox consistency in the secondary headbox was about 0.1%. Forming was conducted at speed of about 24 m/min, and the basis weight of the formed two-ply paper was about 55.3 g/m$^2$, with the first ply (with poly(m-phenylene isophthalamide)fibrids) having a basis weight of about 28.1 g/m$^2$, while the second ply (with PFA) having a basis weight of about 27.2 g/m$^2$. The formed paper was calendered in two plies with the PFA-rich plies being in the middle face-to-face. Calendering was conducted between two metal rolls 20 cm in diameter. The roll temperature was about 300° C., linear pressure about 1300 N/cm and speed about 5 m/min. The calendered paper had a basis weight of about 91.2 g.m$^2$, a thickness of about 0.128 mm, and a density of about 0.72 g/cm$^3$, with a greater concentration of PFA at the center (of thickness) of the sheet and a lower concentration of PFA at outer surfaces, as observed with an optical microscope. The paper was prepreged with a commercial multi-functional epoxy described above using standard techniques known in the industry. Epoxy resin content in the prepreg was about 37 wt. %. The final copper clad laminates containing 1, 2, and 16 plies of prepreged material were produced in a vacuum platen press under conditions described in Example 2. These laminates had about 28 weight % of PFA, about 35 weight % of aramid components, and about 37 weight % of epoxy resin based on total weight of polymeric components (but not including the copper).

Example 12

Pellets of LCP were refined in a 91.4 cm diameter Sprout-Waldron Model 36-2 single rotating disc refiner equipped with plates type 16808 at feeding speed of about 1.5 kg/min., with addition of about 98.8 kg of water per kg of the pellets. After a first pass, pulp produced was diluted to consistency of about 0.8 wt. % and refined a second time with double recirculation of the slurry through the refiner at gap between plates of about 0.25 mm. Refined LCP pulp was screened through an Ahlstrom F1 Master Screen with slots 0.36 mm wide. Two batches of the stock were prepared. The slurry of the first batch had the following percentages (as a percent of total solids) of solid materials:

poly(m-phenylene isophthalamide)fibrids (freeness 240 ml of Shopper-Riegler) 15%;
poly(p-phenylene terephthalamide) floc 85%.

The slurry of the second batch had the following percentages (as a percent of total solids) of solid materials:

poly(m-phenylene isophthalamide)fibrids (freeness 240 ml of Shopper-Riegler) 10%;
LCP pulp 90%.

Two-ply forming was conducted on an inclined wire papermaking machine with feeding of the slurry of the first batch into the primary headbox and feeding of the slurry from the second batch into the secondary headbox. Headbox consistency in the primary headbox was about 0.01% and headbox consistency in the secondary headbox was about 0.1%. Forming was conducted at a speed of about 30 m/min. Basis weight of formed two-ply paper was about 46.10 g/m$^2$, with the first ply (with poly(m-phenylene isophthalamide)fibrids) being about 29.4 g/m$^2$ and the second ply (with LCP) being about 16.7 g/m$^2$. The paper was calendered in two plies with LCP-rich plies being in the middle face-to-face. Calendering was conducted between two metal rolls 86 cm diameter each in two passes. During the first pass the roll temperature was about 340° C., linear pressure about 7300 N/cm and speed about 30 m/min. During the second pass, the roll temperature was 60° C., the sheet was heated in the oven before the nip to a temperature of about 200° C., linear pressure was about 7600 N/cm and the speed was about 15 m/min. The calendered paper had a basis weight of about 94.6 g/m$^2$, a thickness of about 0.104 mm, and a density of about 0.91 g/cm$^3$, with a greater concentration of LCP at the center of the sheet and a lower concentration of LCP at the outer surfaces, as observed using an optical microscope.

The paper was corona treated on both sides at a power density of about 490 dynes and residence time under the electrode about 0.42 seconds. The corona treated paper was prepreged with a commercial multi-functional epoxy described above using standard techniques known in the industry. Epoxy resin content in the prepreg was about 40 wt. %. The final copper clad laminates containing 1, 2, and 16 plies of prepreged material were produced in the vacuum platen press under the conditions described in Example 2. These laminates had about 20 weight % of LCP, about 40 weight % of aramid components, and about 40 weight % of epoxy resin based on the total weight of polymeric materials in the laminate (not including the copper).

Example 13

Strand cut pellets of LCP were refined on a 30.5 cm diameter Sprout-Waldron type C-2976-A single rotating disc refiner equipped with plates in one pass at gap between plates of about 25 μm, feeding speed of about 60 g/min. and continuous addition of water in quantity of about 4 kg of water per 1 kg of the pellets. This LCP pulp was additionally refined with a Bantam® Micropulverizer, Model CF, to pass through a 60 mesh screen. A slurry was prepared by mixing the LCP pulp with PPTA. The resulting slurry had the following percentages (as a percent of total solids) of solid materials:

LCP pulp 90%;
PPTA floc 10%.

A continuous sheet (1) was formed from the slurry on a Rotonier (combination of Rotoformer and Fourdrinier) papermaking machine equipped with horizontal thru-air drier.

The headbox consistency was about 0.01%, forming speed about 5 m/min and temperature of air in the drying section of about 338° C. The sheet (1) had a basis weight of 68.1 g/m$^2$, a thickness of 0.443 mm, and an apparent density of 0.155 g/ml.

A continuous sheet (2) was formed on the same papermaking machine from a slurry containing PPTA floc only. A metal calender roll (diameter about 15 cm) was placed between the drying section and the wind-up stand, so one-step forming and calendering in-line were conducted. The headbox consistency was about 0.01%, line speed was about 5 m/min, temperature of air in the drying section was about 180° C., temperature of work rolls of the calender was about 350° C. and linear pressure in the nip was about 1000 N/cm.

Sheet (2) had a basis weight of 95.6 g/m$^2$, a thickness 0.106 mm, and an apparent density of 0.90 g/ml.

A piece 25×21 cm was cut from the sheet (1), covered on both sides with an aluminum foil treated with a mold release (Mono-Coat® 327W sold by Chem-Trend Inc.) and placed in a platen press MTP-20 (sold by Tetrahedron Associates, Inc.) between two brass cover plates each 1 mm thick. The sheet was compressed in the press under the following conditions:

temperature 350° C., pressure 430 kPa for 1 min;
cooling to 150° C. at constant pressure of 430 kPa.

The compressed sheet (1) had a thickness of 0.056 mm and an apparent density of 1.22 g/ml.

A piece 25×21 cm of compressed sheet (1) was placed between two 25×21 cm pieces of sheet (2). The three-ply structure was covered on both sides with an aluminum foil treated with the mold release and placed in the platen press between two brass cover plates as described above. The lamination of the three plies was conducted under the following conditions:

temperature 350° C., pressure 170 kPa for 1 min;
cooling to 150° C. at constant pressure of 170 kPa.

The final sheet had a basis weight of 259 g/m$^2$, a thickness of 0.253 mm, and an apparent density of 1.02 g/ml, with a maximum concentration of LCP at the center (of thickness) of the sheet and almost no LCP at both outside surfaces, as observed by optical microscopy.

What is claimed is:

1. A sheet, comprising:
   (a) one or more nonwoven layers comprising short lengths of high tensile modulus fibers, and
   (b) a thermoplastic polymer having low moisture absorption;
   wherein at least a portion of said thermoplastic polymer is bound to at least some of said high tensile modulus fibers; and through a cross section of the thickness of said sheet, a concentration of said thermoplastic polymer having low moisture absorption, relative to a total concentration of said high tensile modulus fibers is greater at a center of thickness of said sheet than at an outer surface of said sheet.

2. The sheet as recited in claim 1 wherein said thermoplastic polymer is a thermotropic liquid crystalline polymer.

3. The sheet as recited in claim 1 wherein said high tensile modulus fibers comprise an aramid.

4. The sheet as recited in claim 2 wherein said high tensile modulus fibers comprise an aramid.

5. The sheet as recited in claim 3 wherein said thermoplastic polymer comprises a perfluoropolymer.

6. The sheet as recited in claim 1 wherein said high tensile modulus fibers comprise fibers and fibrils.

7. The sheet as recited in claim 1 wherein said high tensile modulus fibers comprise fibers and fibrids.

8. The sheet as recited in claim 1 wherein said high tensile modulus fibers are fibers only.

9. A structure, comprising, one or more sheets according to claim 1, and an uncured thermoset resin which is impregnated into, and coats, said one or more sheets.

10. The structure as recited in claim 9, further comprising at least one metal sheet.

11. The structure as recited in claim 9, wherein said uncured thermoset resin is subsequently cured.

12. The structure as recited in claim 10, wherein said uncured thermoset resin is cured.

13. A circuit board, chip package, chip carrier, or chip package interposer comprising the sheet of claim 1.

14. A circuit board, chip package, chip carrier, or chip package interposer comprising the structure of claim 11.

15. A circuit board, chip package, chip carrier, or chip package interposer comprising the structure of claim 12.

* * * * *